United States Patent
Colombo et al.

[11] Patent Number: 5,820,681
[45] Date of Patent: Oct. 13, 1998

[54] UNIBODY CRUCIBLE AND EFFUSION CELL EMPLOYING SUCH A CRUCIBLE

[75] Inventors: Paul E. Colombo, White Bear Lake, Minn.; Robert F. Donadio, Hudson, N.H.

[73] Assignee: Chorus Corporation, White Bear Lake, Minn.

[21] Appl. No.: 433,033

[22] Filed: May 3, 1995

[51] Int. Cl.$^6$ .................................................. F27B 14/10
[52] U.S. Cl. .......................... 118/726; 428/34.4; 219/420; 219/421; 392/389; 432/263; 432/265; 432/156; 432/157
[58] Field of Search .................................. 428/34.4, 698; 501/96; D9/500; D11/152; D7/598; 392/388, 389; 219/420, 421; 432/156, 157, 262, 265, 263; 118/726

[56] References Cited

U.S. PATENT DOCUMENTS

| | | | |
|---|---|---|---|
| D. 282,894 | 3/1986 | Watson et al. | D7/598 |
| D. 295,145 | 4/1988 | Jeanjean | D9/500 |
| 4,217,855 | 8/1980 | Takagi | 118/719 |
| 4,646,680 | 3/1987 | Maki | 118/726 |
| 4,812,326 | 3/1989 | Tsukazaki et al. | 427/38 |
| 4,833,319 | 5/1989 | Knauer | 250/251 |
| 4,856,457 | 8/1989 | Knauer | 118/666 |
| 5,034,604 | 7/1991 | Streetman et al. | 392/388 |
| 5,099,791 | 3/1992 | Tsukazaki et al. | 118/723 |
| 5,158,750 | 10/1992 | Finicle | 422/102 |
| 5,432,341 | 7/1995 | Gspann | 392/389 |
| 5,574,958 | 11/1996 | Kawano | 422/186 |

FOREIGN PATENT DOCUMENTS 1164034  10/1958  France .

OTHER PUBLICATIONS

Crucible Weldment —175, 2.75", 4.5" CF Mount Drawing, EPI, 1290 Hammond Rd., St. Paul, Minnesota, drawn May 18, 1992.

*Primary Examiner*—Rena L. Dye
*Attorney, Agent, or Firm*—Merchant, Gould, Smith, Edell, Welter & Schmidt, P.A.

[57] ABSTRACT

A unibody, monolithic, one-piece negative draft crucible for a MBE effusion cell. The crucible maximizes capacity, uniformity and long term flux stability, and minimizes oval defects, depletion effects, and short term shutter-related flux transients. The invention also provides a method and mandrel apparatus for making a unibody containment structure, such as a crucible formed of PBN, having a negative draft, via chemical vapor deposition.

16 Claims, 4 Drawing Sheets

UNIBODY CRUCIBLE AND EFFUSION CELL EMPLOYING SUCH A CRUCIBLE

BACKGROUND OF THE INVENTION

1. Field of the Invention.

This invention relates, generally, to apparatus used in the manufacture of components in the compound semiconductor and related industries. More particularly, the invention relates to a crucible for a molecular beam epitaxy (MBE) effusion cell or source. The invention also provides a method and apparatus for the manufacture of the crucible.

2. Background Information.

Molecular beam epitaxy is a growth process which involves the deposition of thin films of material onto a substrate in a vacuum by directing molecular or atomic beams onto the substrate. Deposited atoms and molecules migrate to energetically preferred lattice positions on the substrate, which is heated, yielding film growth of high crystalline quality, and optimum thickness uniformity. MBE is widely used in compound semiconductor research and in the semiconductor device fabrication industry, for thin-film deposition of elemental semiconductors, metals and insulating layers.

A principal apparatus utilized in MBE deposition is the thermal effusion cell or source. Thermal effusion cells have a crucible which contains the effusion material, for example gallium, arsenic, or other elements or compounds. The crucible is heated by a resistive filament to heat and effuse the material out of an orifice into an ultra high vacuum growth chamber for deposit on the substrate, which is located in the chamber. Typically, a plurality of cells are mounted, via ports, in the growth chamber. One or more of the cells are actuated and generate a beam which is directed at a predetermined angle toward the substrate which is mounted on a substrate holder. Control of the beam is typically accomplished via shutters and/or valves. In use, various preparatory procedures are performed on the substrate, the cells are powered up, heated and unshuttered, and desired epitaxial deposition is accomplished on the heated, rotating substrate. After growth is completed, the formed wafer is cooled, inspected, and processed for removal from the chamber.

Source crucibles are constructed of an inert material which is stable at high effusion temperatures. A preferred material is pyrolytic boron nitride (PBN). The crucibles are typically formed by a chemical vapor deposition (CVD) process utilizing a forming mandrel in a vacuum chamber. In the past, various crucible designs and configurations have been used in MBE. However, these prior art crucibles have significant limitations. The primary problems associated with existing crucibles are: (1) low capacity, (2) lack of uniformity, (3) oval defect production, (4) short term flux transients, and (5) long term flux transients.

Capacity relates to the ability of the crucible to hold an amount of material necessary for a particular MBE process. Greater capacity permits construction of larger and/or a greater number of devices per load of source material. Desired capacity has been achieved in some designs by utilizing a straight-wall, cylindrical configuration. However, crucibles having a cylindrical configuration throughout tend to provide poor depositional uniformity because the beam emitted from the zero draft cylindrical orifice is too tightly limited.

Uniformity relates primarily to the uniformity of the thickness of the layers deposited over the target substrate area via the material emitted from the orifice of the crucible. Uniformity may also be compositional. Uniformity has been achieved in some designs by utilizing a conically configured crucible body with a positive draft. However, crucibles having a conic configuration throughout have limited capacity, exhibit depletion effects, and are prone to flux transients.

Oval defects are morphological defects present on the formed semiconductor device. Source related oval defects are thought to be caused by spitting from the material melt at the crucible base which occurs when droplets of condensed material form at the crucible orifice and then roll back into the melt. Material condenses at the orifice due to a reduced temperature in the orifice region. Oval defect production has been reduced in some designs by heating the orifice or lip of the crucible to prevent material condensation. Such designs are commonly referred to as "hot lip" devices. A problem with some hot lip source designs is that they produce a hydrodynamically unstable flux, they tend to produce undesirable levels of impurities, and they often exhibit depletion effects.

Short term or shutter-related flux transients are changes in the effusion rate over time due to the activation of the source shutter. Long term flux transients are changes in effusion rate over time due to decreases in the surface area of the melt. Flux transients are particularly a problem in crucible designs having a conic configuration throughout.

Short and long term flux transients have been reduced in a design manufactured by applicants' assignee which utilizes a dual filament crucible heating system along with a straight-wall, cylindrical crucible body combined with a conic insert at the orifice end. In the dual filament system, one filament heats the base of the crucible and another filament, which is controlled independently, heats the lip of the crucible. This yields a "hot lip" system which reduces oval defect production and also minimizes hydrodynamic instability and rapid depletion effect typically experienced in hot hp crucible designs. Further, the large crucible volume provided by the straight wall crucible in combination with the insert, forms a thermal baffle between the melt and the shutter further improving hydrodynamic stability. Although this design represents an advance over other prior art crucibles, it appears to have a shortcoming; namely the lip heating filament is not believed to be optimally disposed in close proximity to the conic insert due to the presence of the outer wall of the cylindrical crucible body.

Despite the need in the art for an effusion cell crucible design which overcomes the disadvantages, shortcomings and limitations of the prior art, none insofar as is known has been developed.

Accordingly, it is an object of the present invention to provide a unibody, monolithic, negative draft crucible for a MBE effusion cell. It is a further object of this invention to provide a crucible which maximizes capacity, uniformity and long term flux stability, and minimizes oval defects, depletion effects, and short term shutter-related flux transients. It is a further object of this invention to provide a method and apparatus for making a unibody containment structure, such as a crucible formed of PBN, having a negative draft, via chemical vapor deposition. Finally, it is an object of the present invention to provide a unibody, one-piece crucible, and a method and apparatus for its manufacture.

SUMMARY OF THE INVENTION

In a first basic aspect, the present invention provides a container comprising a rigid wall structure constructed of a single piece of material and having a predetermined configuration defining an interior space, the interior space having a first peripheral dimension, the wall structure having at least one orifice, the orifice having a second peripheral dimension, the second peripheral dimension being less than the first peripheral dimension.

In a second basic aspect, the invention provides a rigid structure formed by the process comprising:

(a) providing a mandrel having a predetermined configuration, the mandrel comprising at least one portion having a predetermined oxidation temperature which is less than that of the structure;

(b) forming the structure around the mandrel; and (c) heating the structure and mandrel at a temperature at least equal to the predetermined oxidation temperature of the mandrel portion for a predetermined time period, whereby the at least one mandrel portion is oxidized.

In a third basic aspect, the invention provides a process for making a structure, comprising the steps of:

(a) providing a mandrel having a predetermined configuration, the mandrel comprising at least one portion having a predetermined oxidation temperature which is less than that of the structure;

(b) forming the structure around the mandrel by chemical vapor deposition; and (c) heating the structure and mandrel at a temperature at least equal to the predetermined oxidation temperature of the mandrel portion for a predetermined time period, whereby at least one mandrel portion is oxidized.

In a fourth basic aspect, the invention provides a chemical vapor deposition mandrel for making a structure comprising a body with a predetermined configuration, the body having at least one separable portion with a predetermined oxidation temperature which is less than that of the structure.

The features, benefits and objects of this invention will become clear to those skilled in the art by reference to the following description, claims and drawings.

DESCRIPTION OF THE PREFERRED EMBODIMENTS

1. Effusion Cell Design.

Figure 1:
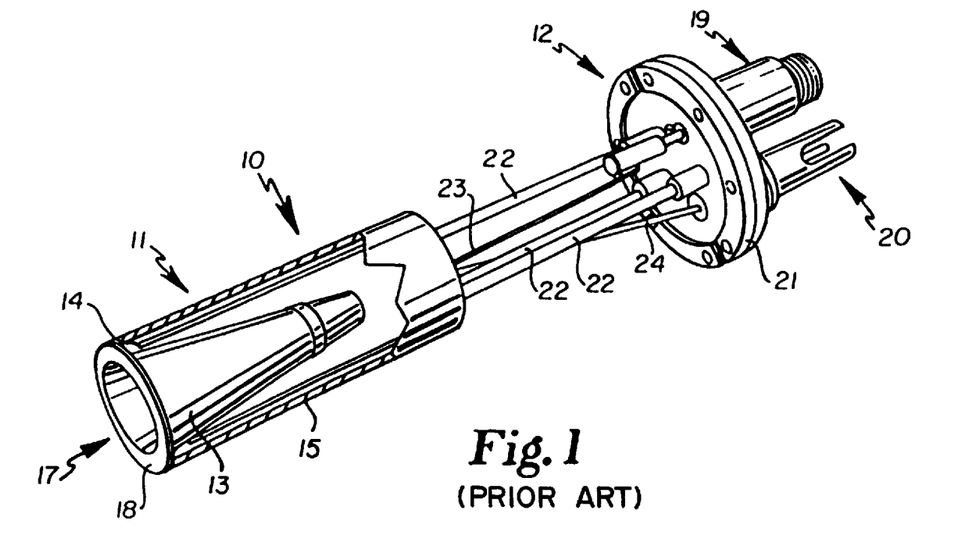
FIG. 1 is a perspective view, partially cut-away, of an MBE effusion cell having a prior art crucible which has a conical configuration.

The crucible of the present invention is well suited for use in an MBE effusion cell. Referring to FIG. 1, a typical MBE effusion cell 10, such as one manufactured by EPI MBE Equipment Group of St. Paul, Minn. USA, generally comprises a head assembly 11 and a mounting flange and support assembly 12. The mounting flange and support assembly 12 couples the effusion cell 10 to an MBE growth chamber (not shown). The assembly 12 further supports the head assembly 11 at a predetermined position within the growth chamber. The mounting flange and support assembly 12 includes a cylindrical sealing flange 21 of a predetermined diameter, and externally oriented screw on-type power and Omega™-type thermocouple connectors 19 and 20, respectively, connected to the flange 21. Internally oriented supports 22 of a predetermined length are connected to the opposite side of the flange 21. Power conductors 23 and thermocouple lead 24 extend from the power connector 19 and thermocouple connector 20, respectively, through the flange 21 and to the head assembly 11. The head assembly 11 includes a centrally interiorly disposed crucible 13 surrounded by a filament 14 and a heat shield 15. The filament 14 is preferably constructed of Tantalum with a PBN insulation. The heat shield 15 is preferably constructed of multiple layers of high purity Tantalum foil. A band-shaped thermocouple 16 is connected to the exterior of the crucible 13 near its base. The power conductors 23 are connected to the filament 14 and the thermocouple leads 24 are connected to the thermocouple 16. The crucible 13 has a conical configuration with an outwardly oriented orifice 17 of a predetermined diameter with an annular lip 18. The crucible 13 is constructed of PBN, for example. The effusion cell 10 may include various optional features such as an integral shutter, an integral water cooling system, and the like.

Figure 2:
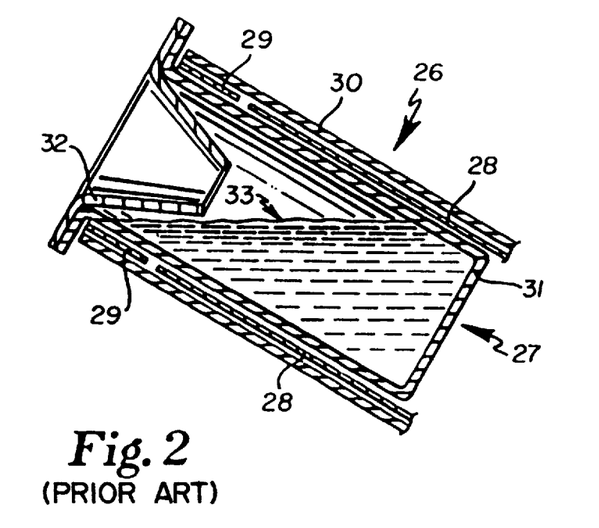
FIG. 2 is a crossectional view of a portion of a dual filament effusion cell having a prior art crucible which has a straight wall, cylindrical body and a conical insert.
Figures 3, 4:
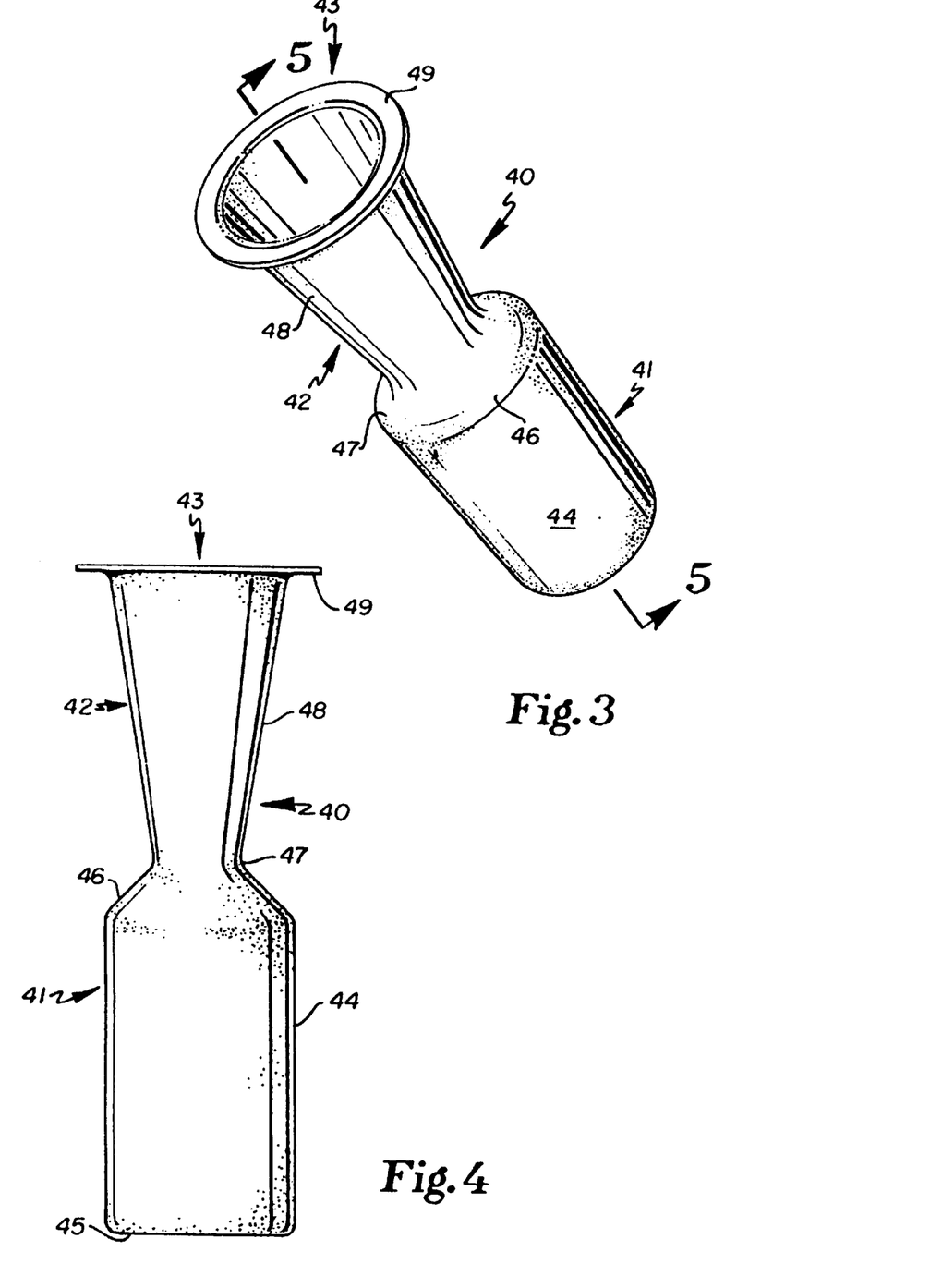
FIG. 3 is a perspective view of an embodiment of the unibody, monolithic negative draft MBE crucible of the present invention.
FIG. 4 is a front view of the crucible shown in FIG. 3.

FIG. 2 shows another head assembly structure manufactured by EPI MBE Equipment Group, with an improved, dual filament heating system and an improved, but multi-piece crucible design. The heating system includes a first filament 28 for heating the bottom or base region of a crucible 27 and a second filament 29 for heating the top or tip region of the crucible 27. The filaments 28 and 29 are independently controlled to permit differential heating of various parts of the crucible 27. Heat shielding 30 surrounds the crucible 27 and filaments 28 and 29. This dual filament structure permits improved functionality. The crucible 27 comprises a cylindrical body 31 and a conical insert 32. The cylindrical body 31 has straight or substantially straight walls with little or no positive draft (taper), and no negative draft. The walls of the body 31 define a predetermined interior volume which is relatively large compared to that of the conical crucible 13 shown in FIG. 1. The conical insert 32 has a pronounced positive draft. The aforementioned structure provides a "hot lip" configuration which reduces oval defect production. In addition, the differential heating provided by the dual filaments 28 and 29 minimizes hydrodynamic instability and rapid depletion effect common in other hot lip source designs.

Although the design of crucible 27 shown in FIG. 2 provides several advantages over the crucible 13 shown in FIG. 1, it does have an important limitation. Specifically, the crucible body 31 separates, and insulates to a certain extent, the tip filament 29 from the conical insert 33. This separation is believed to provide less than optimal heating of the insert 33. The present invention integrates the structure of the negative draft or taper conical insert into the crucible body to form a unitary crucible body, whereby the tip filament of the dual filament heating system may now be optimally disposed with respect to the tip. Additionally, the size and configuration of the conical section may be optimized. The invention further provides a method and apparatus for constructing a monolithic, unibody crucible having a negative draft portion via chemical vapor deposition.

2. Crucible Structure.

An embodiment of the unibody crucible 40 of the present invention is shown in FIGS. 3–7. The crucible 40 generally comprises a base section 41 and a conical section 42 with a first or outer orifice 43 disposed at one end of the conical section 42 and open to the exterior of the crucible 40. The base section 41 and conical section 42 form a single, unitary piece. The crucible 40 is formed of an inert, corrosion resistant material. A preferred material is PBN, such as Pyrosyl® sold by CVD Products, Inc. of Hudson, N.H. The preferred thickness of PBN for the crucible 40 is approximately 0.035 inches (0.08 cm). The crucible 40 is constructed via a chemical vapor deposition process set forth in detail below. All boundary edges between the base member 41 and conical member 42 elements mentioned below in detail are preferably radius edges. The crucible 40 embodiment shown is approximately 5.3 inches(13.4 cm) in length, although the length and other dimensions may be varied consistent with the basic teachings of this invention.

The base section 41 has a substantially cylindrical configuration with a side wall 44, a bottom 45 disposed at one end of the side wall 44, and a negative draft tapered wall or neck 46 disposed at the opposite end of the side wall 44. The side wall 44 has a predetermined substantially uniform circumference and a predetermined length. The diameter of the base section 41 shown is approximately 1.4 inches (3.5 cm). The length base section 41 is approximately 2.9 inches (7.3 cm). The negative draft wall 46 tapers inwardly (laterally) towards the central longitudinal axis (not shown) of the crucible 40 (and hence, the side wall 44) preferably at an angle approximately 45.0 degrees with respect to the longitudinal plane of the exterior of the base section 41. The negative draft wall 46 terminates at its outward end to define a second or inner orifice 47. The second orifice 47 is a region of smallest diameter in the crucible 40 and is approximately 0.6 inches (1.5 cm) in this embodiment.

The conical section 42 is defined by the portion of the crucible extending from the second orifice 47 to the periphery of the first orifice 43. The conical section 42 comprises a positive draft wall 48 and an annular lip 49. The length of the conical section in this embodiment is approximately 2.3 inches (5.8 cm.). The wall 48 tapers outwardly (laterally) away from the central longitudinal axis of the crucible 40 at a preferred approximate angle of 9.0 degrees measured with respect to the central axis. The annular lip 49 extends outwardly from the terminal edge of the wall 48 preferably at a right angle thereto. The first orifice has a preferred diameter of approximately 1.5 inches (3.8 cm.) in the embodiment shown. The annular lip 49 has a width of approximately 0.8 inches (2.0 cm).

Figures 5, 6, 7:
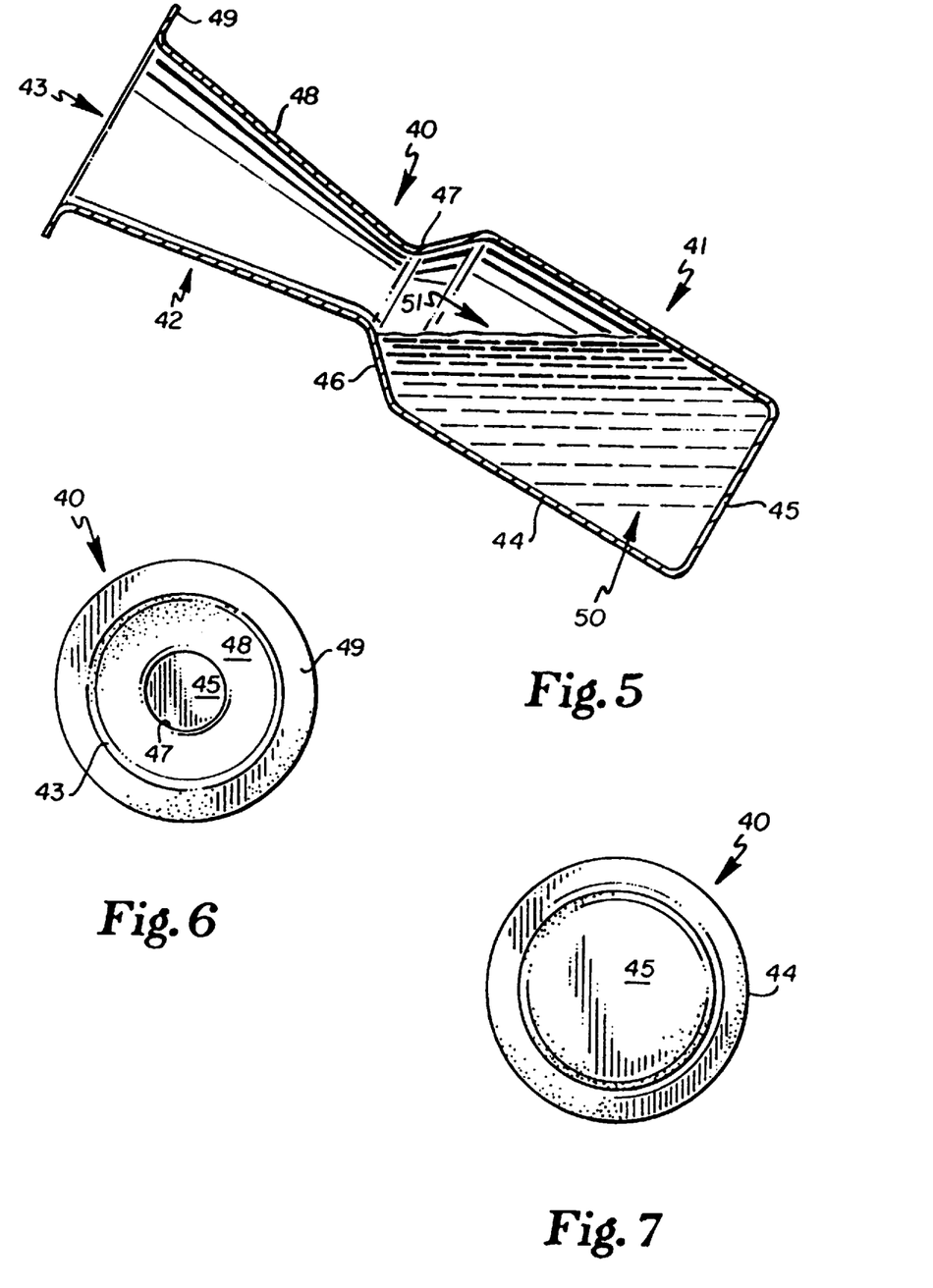
FIG. 5 is crossectional view of the crucible taken along line 5—5 of FIG. 3.
FIG. 6 is a top view of the crucible as shown in FIG. 4.
FIG. 7 is a bottom view of the crucible.
Figure 8:
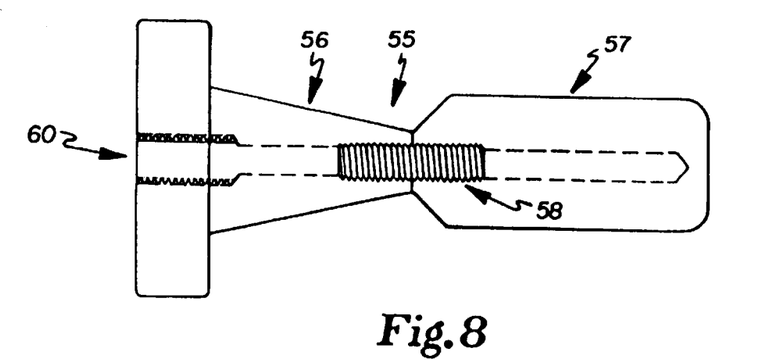
FIG. 8 is a side view, partially in crossection, of the CVD mandrel assembly used to produce the unibody crucible.

As is best shown in FIG. 5, the crucible 40 is typically oriented upwardly at an angle for MBE. An element or compound is added to the crucible and heated by the dual filament system, for example, of an effusion source to form a melt 50. In use, the conical section 42 of the crucible 40 yields a level of thickness uniformity which matches that provided by conical crucibles. Additionally though, the design minimizes depletion effects. In all types of cells the beam equivalent pressure at a constant cell temperature decreases over time due to depletion of the source melt material. This effect is greater in cells using conical crucibles because of more rapid reductions in melt surface area in those cells. The effect is further increased in hot lip cells because they are typically somewhat less efficient in their use of material. Presumably, this is due to reevaporation from the hot lip area, such reevaporation not being directed toward the substrate. The crucible 40 of this invention virtually eliminates depletion effect by providing a melt surface 51 which is consistent in size (area) and shape. The portion of the melt surface 51 "seen" by the substrate is equivalent to the size of the inner orifice 47. In contrast, in crucibles which are conic throughout, the distance between the crucible orifice and the melt surface increases and the melt surface area decreases as the melt charge depletes in volume, thus causing them to exhibit depletion effects. Another advantage of the crucible 40 of this invention is the large crucible volume provided by the straight wall, cylindrical base section 41, which increases useful capacity in comparison to conical crucibles. A further advantage is that the inner orifice 47 provided by the integral conical section 42 forms a thermal baffle between melt 50 and the shutter (not shown) improving hydrodynamic stability and reducing shutter-related transients. Finally, the integrally formed conical section 42 enables optimal positioning of the tip filament of the dual filament heating system to minimize oval defect production.

Figures 9, 10, 11, 12, 13:
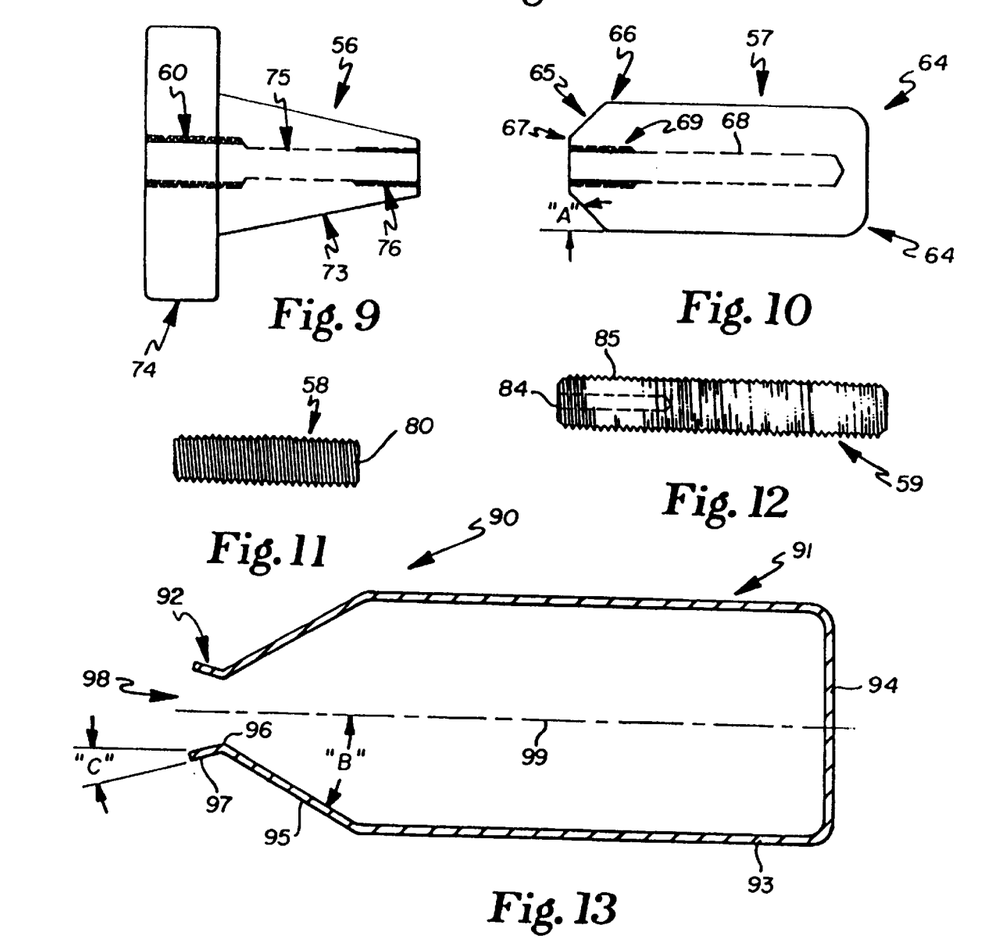
FIG. 9 is a side view, partially in crossection, of the top member of the mandrel assembly.
FIG. 10 is a side view, partially in crossection, of the bottom member of the mandrel assembly.
FIG. 11 is a side view of a center stud member of the mandrel assembly.
FIG. 12 is a side view of a hanger member which is attached to the mandrel assembly to hang it in an operative orientation during CVD.
FIG. 13 is a crossectional view, taken along the center axis, of another embodiment of the unibody, monolithic negative draft MBE crucible of the present invention.

Another embodiment of the unibody crucible 90 is shown in FIG. 13. The one piece design crucible 90 is cylindrical and generally comprises a base section 91 and a conical section 92, with a first or outer orifice 98 disposed at one end of the conical section 92. The crucible 90 is preferably constructed of PBN via a vapor deposition process. This particular crucible 90 embodiment is approximately 8.1 inches(20.5 cm) in length, 2.9 inches (7.3 cm.) widest diameter at the base 91, and 0.9 inches (2.2 cm.) narrowest diameter at an inner orifice 96.

The base section 91 has straight side walls 93 and a bottom wall 94 5 closing one end. Tapered wall 95 is disposed at the opposite end of the wall 93 and has a negative draft angle "B" of approximately 30 degrees measured with respect to the axis 99 of the crucible 90. Conical section 92 has a tapered wall 97 with a positive draft angle "C" of approximately 15 degrees. Importantly, the conical section 92 has a significantly reduced size (approximately 0.3 inches (0.7 cm.) axial length) in comparison to the conical section 42 of crucible 40 shown in FIGS. 3–7. The unibody design permits construction of a crucible 90 which is essentially a "virtual crucible" in that it has a very small orifice or nozzle and enables placement of the effusion cell shutter very close to the source material or melt. The shutter may also be made much smaller because of this. In contrast, the prior art teaches large orifices and requires a cell design wherein the shutter is large and is disposed a greater distance away from the source.

3. Crucible Method of Manufacture.

The crucibles 40 and 90 described above are constructed by chemical vapor deposition. Chemical vapor deposition is practiced, for example, by CVD Products, Inc. The preferred material for construction of the crucible shown is PBN. In chemical vapor deposition, PBN is produced by introducing gaseous boron trichloride, ammonia and a diluant into a growth chamber at a submillimeter pressure and a temperature of approximately 1800 degrees Celsius (C.). This method may, however, also be used in conjunction with other chemicals to make various materials by chemical vapor deposition.

Referring to FIGS. 8–12, the PBN yielded from the reaction of compounds is deposited on a forming mandrel 55. Upon completion of the CVD process, the formed structure, in this case a crucible, is separated from the mandrel 55 by a process described below. The forming mandrel 55 is a four part assembly constructed of graphite. It basically comprises a top member 56, a bottom member 57, and a center stud or nipple 58. The top and bottom member 56 and 57 are separate components which are connected by the center stud 58. In the CVD chamber, the forming mandrel 55 is maintained in an operative position by a top stud 59 which is connected to a threaded bore 60 centrally disposed in the top end of the top member 56.

The bottom member 57 is formed of graphite, preferably a flue grained, high density, pre-purified graphite, and has a hollow, bored out center. Graphite begins to oxidize at approximately 300 degrees C. The dimensions of the bottom member 57 are dependent of the dimensions of the crucible to be formed. In the case of the crucible 40, the member 57 is cylindrical and approximately 3.1 inches long and 1.3 inches in diameter. The bottom edge 64 of the member 57 has a radius. Importantly, the top edge has a negative draft forming tapered neck 65 of angle "A", preferably 45 degrees. As is best shown in FIG. 10, both ends 66 and 67 of the tapered portion or neck 65, are radiused. The diameter of the top end of the neck 65 is preferably approximately 0.58 inches. An axial bore 68 in the bottom member 57 is preferably 5/16 inch in diameter and 2 and 7/8 inches deep. Anal bore 68 has a threaded upper portion 69, which is 3/4 inches deep and 3/8–16 UNC.

Referring to FIG. 9, the top member 56 is also hollow and formed of graphite, preferably a fine grained, high density, pre-purified graphite. The dimensions of the top member 56 are also dependent of the dimensions of the crucible to be formed. Importantly, the member 56 is curvilinear with a positive draft forming tapered neck 73 and a lip forming base 74. In the case of the crucible 40, the member 56 taper neck 73 has a length of approximately 2.1 inches, a bottom diameter of approximately 0.58 inches, and a top diameter of approximately 1.4 inches. The base 74 has a diameter of 2.8 inches and a thickness of 0.7 inches. The junction of the neck 73 and base 74 is preferably radiused. An axial bore 75 in the top member 56 is preferably 5/16 inch in diameter and drilled through the entire length of the member 56. Axial bore 75 has a threaded upper portion 60, which is 1.0 inch deep and 3/4–10 UNC, and a threaded bottom portion 76 which is 3/4 inches deep and 3/8–16 UNC.

Referring to FIG. 11, the center stud 58 is also hollow and constructed of graphite, preferably a fine grained, high density, pre-purified graphite. The dimensions of the stud 58 are dependent upon the size and configuration of the crucible formed and in particular upon the dimensions and type of threaded bores 69 and 76 in top and bottom members 56 and 57, respectively. With respect to the preferred embodiments discussed above, the stud 58 preferably has a length of approximately 1.5 inches, a threaded 3/8–16 UNC periphery, and an axial channel 80, 3/16 inches in diameter. Importantly, the stud 58 wall thickness (equal to one half the outside diameter of the stud 58 body minus the bore 80 diameter) is thick enough to enable tightening together of the top and bottom members 56 and 57, and thin enough to allow the stud 58 to break or fracture during cooling in the crucible forming process described below. This structure, in combination with the type of construction material, yields a stud which will reliably and snugly connect the top and bottom members 56 and 57, and further which will permit the desired break.

Referring to FIG. 12, the top or hanger stud 59 is preferably solid and constructed of graphite, preferably a course grained, extruded graphite. The dimensions of the stud 59 are dependent upon the size and configuration of the crucible formed and in particular upon the dimensions and type of threaded bore 60 in top and bottom member 56. With respect to the crucible 40 embodiment discussed above, the stud 59 preferably has a length of approximately 4.5 inches and a threaded 3/4–10 UNC periphery. The stud 59 has an axial bore 84 in one end which is 3/16 inches in diameter and 1 and 1/2 inches deep. A lateral bore 85, 1/8 inches in diameter, is disposed in the side of the stud 59 and is communicatively connected to the axial bore 84. The left end, as viewed in FIG. 12, of the stud 59 is screwed into aperture 60 of top member 56 a distance such that the lateral bore 85 remains on the exterior of the mandrel 55. The bores 84 and 85 provide a venting means for the interior cavities of the mandrel 55.

The process of manufacturing the crucible of the present invention comprises the following steps. First, the top and bottom member 56 and 57 are mated by screwing them together with the center stud 58. Next, the hanger stud 59 is screwed to the bore 60 of the top member 56. Importantly, the channels 84 and 85 in the hanger stud 59 are oriented to vent pressure in the aligned axial channels 75 and 68 of the assembly 55. The resultant mandrel assembly 55 is placed in a CVD growth chamber. CVD coating of PBN then occurs via a process generally known in the art. After the high temperature growth process is completed, the resultant mandrel/container assembly is cooled. The graphite materials of the forming mandrel 55 contract or shrink at a higher rate than does the PBN due to a high difference in thermal contraction coefficients. In order to prevent the shrinking mandrel material from breaking the thin PBN layer at the low diameter neck region of the crucible, due to contraction along the longitudinal aspect of the mandrel assembly 55, the center stud 58 is designed to fracture. The fracture allows the top and bottom members 56 and 57 of the mandrel 55 to shrink independently inside the PBN shell formed on the outside of the mandrel assembly 55 without damaging it due to longitudinal contraction near the neck region 47 of the crucible 40. After cooling is complete, the assembly is moved to a separate oxidation chamber to remove the bottom member 57. An air injector is inserted into the center cavity of the mandrel 55. The assembly is heated at a temperature above 300 degrees C., preferably 750 degrees C., for a predetermined period of time, preferably approximately 40 hours, to oxidize the bottom member 57 which is now "inside" base section 41 of the formed PBN crucible 40. The flow of air into the heated bottom member 57 is adjusted via the injector to optimize oxidation. Oxidization destroys the bottom member 57, which would otherwise not be able to be removed due to the negative draft angle of the wall 46 of the newly formed crucible base section 41. As PBN has a higher oxidation temperature, being stable in air up to approximately 1,200 degrees C., it does not oxidize during the heating step of the process. Subsequently, the remaining mandrel 55 piece, the top member 56, is slid away from the crucible conic section 42 utilizing its positive draft angle. The process yields a unibody, monolithic crucible with a negative draft portion which is particularly well suited for use in MBE.

Although the method of manufacture discussed above is described in the context of an effusion cell crucible for MBE, the method may be used to manufacture unibody, rigid walled, negative draft containers for various applications. Such structures may be constructed from a variety of compounds produced by chemical vapor deposition. Additionally, those skilled in the MBE art will recognize that other crucible designs may be made using the aforementioned method, including but not limited to a cylindrical body, closed at both ends and having an aperture in the side wall at a predetermined point, with or without an associated conical segment.

The descriptions above and the accompanying drawings should be interpreted in the illustrative and not the limited sense. While the invention has been disclosed in connection with the preferred embodiment or embodiments thereof, it should be understood that there may be other embodiments which fail within the spirit and scope of the invention as defined by the following claims. Where a claim is expressed as a means or step for performing a specified function it is intended that such claim be construed to cover the corresponding structure, material, or acts described in the specification and equivalents thereof, including both structural equivalents and equivalent structures.

The invention claimed is:

1. An effusion cell for creating a molecular beam of material to be deposited epitaxially on a substrate, comprising:

a support assembly comprising a mounting flange and at least one support post extending from the mounting flange; and a head assembly connected to the at least one support post, the head assembly comprising a container for holding the material and a heater surrounding at least a portion of the container for heating the material in the container, the container comprising a rigid wall structure enclosing an interior space, said wall structure being made of pyrolytic boron nitride and having a substantially uniform wall thickness, said wall structure defining a base portion and a neck portion attached to the base portion, the neck portion having a negative draft angle extending away from the base portion and terminating in a neck orifice, the base portion having a first peripheral dimension and the neck orifice having a second peripheral dimension, said second peripheral dimension being less than said first peripheral dimension.

2. The effusion cell as claimed in claim 1, wherein the base portion of the wall structure is substantially cylindrical in shape, and the neck portion of the wall structure is substantially conical in shape.

3. The effusion cell as claimed in claim 1, wherein said wall structure further comprises a conical section connected to the neck portion at the neck orifice, the conical section having an exit orifice, said exit orifice having a third peripheral dimension which is greater than the second peripheral dimension.

4. The effusion cell as claimed in claim 3, wherein said container further comprises a lip disposed about the exit orifice.

5. The effusion cell as claimed in claim 1, wherein said wall structure is constructed of one piece material.

6. The effusion cell as claimed in claim 1, wherein said second peripheral dimension is between approximately 1.5 cm and 2.2 cm.

7. The effusion cell as claimed in claim 1, wherein the ratio of said first peripheral dimension to said second peripheral dimension is between approximately 2.3/1 and 3.2/1.

8. An effusion cell for creating a molecular beam of material to be deposited epitaxially on a substrate, comprising:

a support assembly comprising a mounting flange and at least one support post extending from the mounting flange; and a head assembly connected to the at least one support post, the head assembly comprising a container for holding the material and a heater surrounding at least a portion of the container for heating the material in the container, the container comprising a rigid wall structure enclosing an interior space, said wall structure defining a base portion and a neck portion attached to the base portion, the neck portion having a negative draft angle extending away from the base portion and terminating in a neck orifice, the base portion having a first peripheral dimension and the neck orifice having a second peripheral dimension, said second peripheral dimension being less than said first peripheral dimension;

wherein activation of the heater causes the material in the container to evaporate to form a molecular beam, effuse out of said neck orifice, and be deposited epitaxially on the substrate.

9. The effusion cell as claimed in claim 8, wherein said wall structure is made of a material which is inert, corrosion resistant, and heat stable in air having a predetermined oxidation temperature.

10. The effusion cell as claimed in claim 9, wherein said wall structure is made of pyrolytic boron nitride.

11. The effusion cell as claimed in claim 8, wherein the base portion of the wall structure is substantially cylindrical in shape, and the neck portion of the wall structure is substantially conical in shape.

12. The effusion cell as claimed in claim 8, wherein said wall structure further comprises a conical section connected to the neck portion at the neck orifice, the conical section having a second orifice, said second orifice having a third peripheral dimension which is greater than the second peripheral dimension.

13. The effusion cell as claimed in claim 12, wherein said container further comprises a lip disposed about the second orifice.

14. The effusion cell as claimed in claim 8, wherein said container is constructed of one piece material and is made of pyrolytic boron nitride.

15. The effusion cell as claimed in claim 8, wherein said second peripheral dimension is between approximately 1.5 cm and 2.2 cm.

16. The effusion cell as claimed in claim 8, wherein the ratio of said first peripheral dimension to said second peripheral dimension is between approximately 2.3/1 and 3.2/1.

* * * * *

UNITED STATES PATENT AND TRADEMARK OFFICE
CERTIFICATE OF CORRECTION

PATENT NO. : 5,820,681
DATED : OCTOBER 13, 1998
INVENTOR(S) : COLOMBO ET AL.

It is certified that error appears in the above-identified patent and that said Letters Patent is hereby corrected as shown below:

Col. 2, line 38: "hp" should read --lip--

Col. 6, line 41: delete "5" after "94"

Col. 7, line 16: change "flue" to --fine--

Col. 7, line 29: change "Anal" to --Axial--

Col. 9, line 13: change "fail" to --fall--

Signed and Sealed this

Seventh Day of December, 1999

Q. TODD DICKINSON

Attest:

Attesting Officer

Acting Commissioner of Patents and Trademarks